(12) United States Patent
Lee et al.

(10) Patent No.: US 12,327,800 B2
(45) Date of Patent: Jun. 10, 2025

(54) SEMICONDUCTOR DEVICE AND METHOD FOR SELECTIVE EMI SHIELDING USING A MASK

(71) Applicant: STATS ChipPAC Pte. Ltd., Singapore (SG)

(72) Inventors: GunHyuck Lee, Incheon (KR); HyunKyu Lee, Gyeonggi-do (KR); MinJung Kim, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 678 days.

(21) Appl. No.: 17/647,069

(22) Filed: Jan. 5, 2022

(65) Prior Publication Data

US 2023/0215813 A1    Jul. 6, 2023

(51) Int. Cl.
*H01L 23/552* (2006.01)
*H01L 21/56* (2006.01)
*H01L 23/31* (2006.01)

(52) U.S. Cl.
CPC .......... *H01L 23/552* (2013.01); *H01L 21/561* (2013.01); *H01L 23/3128* (2013.01)

(58) Field of Classification Search
CPC . H01L 23/552; H01L 21/561; H01L 23/3128; H01L 21/6835; H01L 23/66; H01L 2223/6677; H01L 25/16; H01L 21/50; H01L 21/78; H01L 21/4803; H01L 21/56; H01L 23/13
See application file for complete search history.

(56) References Cited

U.S. PATENT DOCUMENTS

| | | | |
|---|---|---|---|
| 9,129,954 B2 * | 9/2015 | Yen | H01L 23/552 |
| 9,859,232 B1 * | 1/2018 | Chiang | H01L 23/3121 |
| 10,910,322 B2 | 2/2021 | Kim et al. | |
| 2013/0037923 A1 | 2/2013 | Yoo | |

* cited by examiner

*Primary Examiner* — Jonathan Han
(74) *Attorney, Agent, or Firm* — Brian M. Kaufman; Robert D. Atkins; PATENT LAW GROUP: Atkins and Associates, P.C.

(57) ABSTRACT

A semiconductor device is made by providing a strip substrate including a plurality of units. A hole is formed in the strip substrate. An encapsulant is deposited over the strip substrate. A mask is disposed over the strip substrate and encapsulant with a leg of the mask disposed in the hole. A shielding layer is formed over the mask and strip substrate. The mask is removed after forming the shielding layer. The strip substrate is singulated to separate the plurality of units from each other after forming the shielding layer.

25 Claims, 19 Drawing Sheets

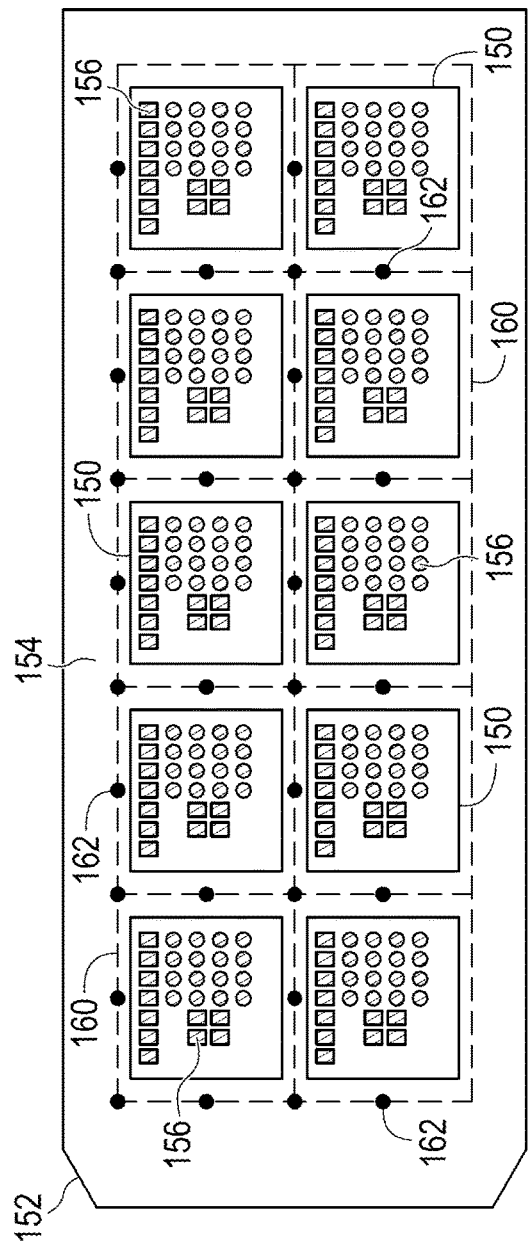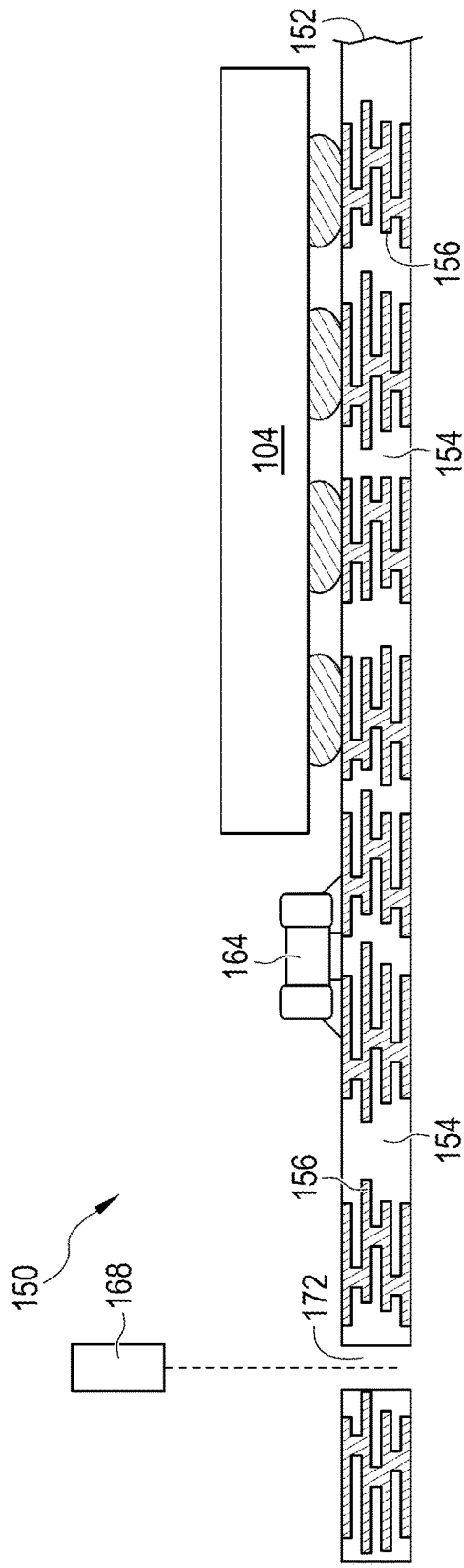

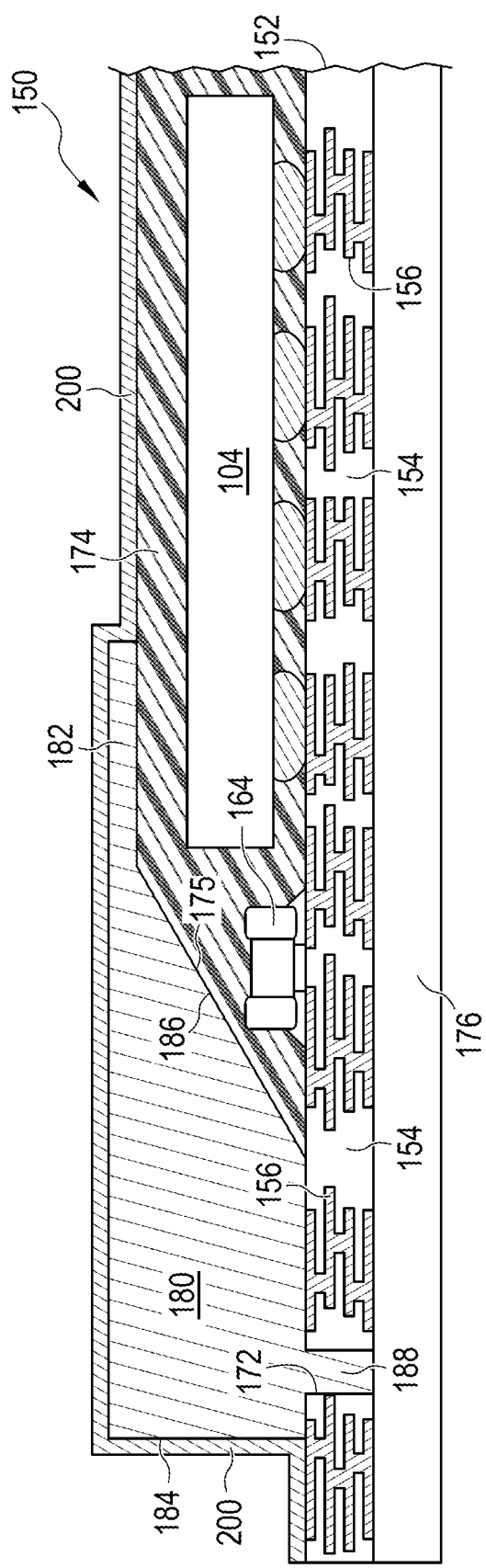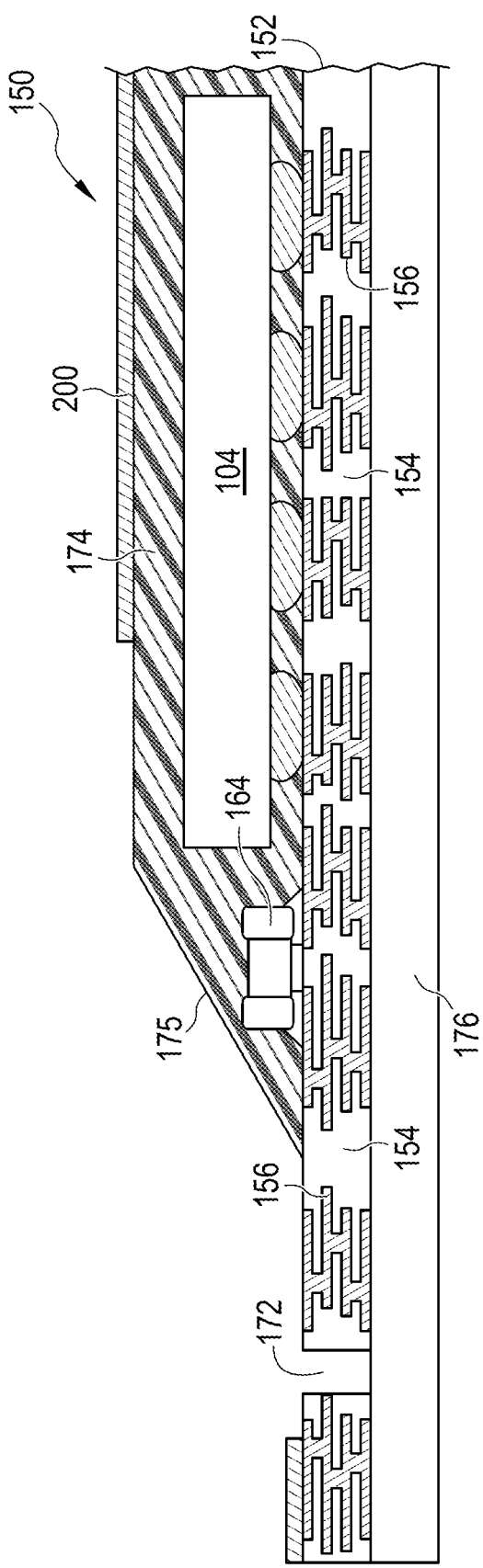

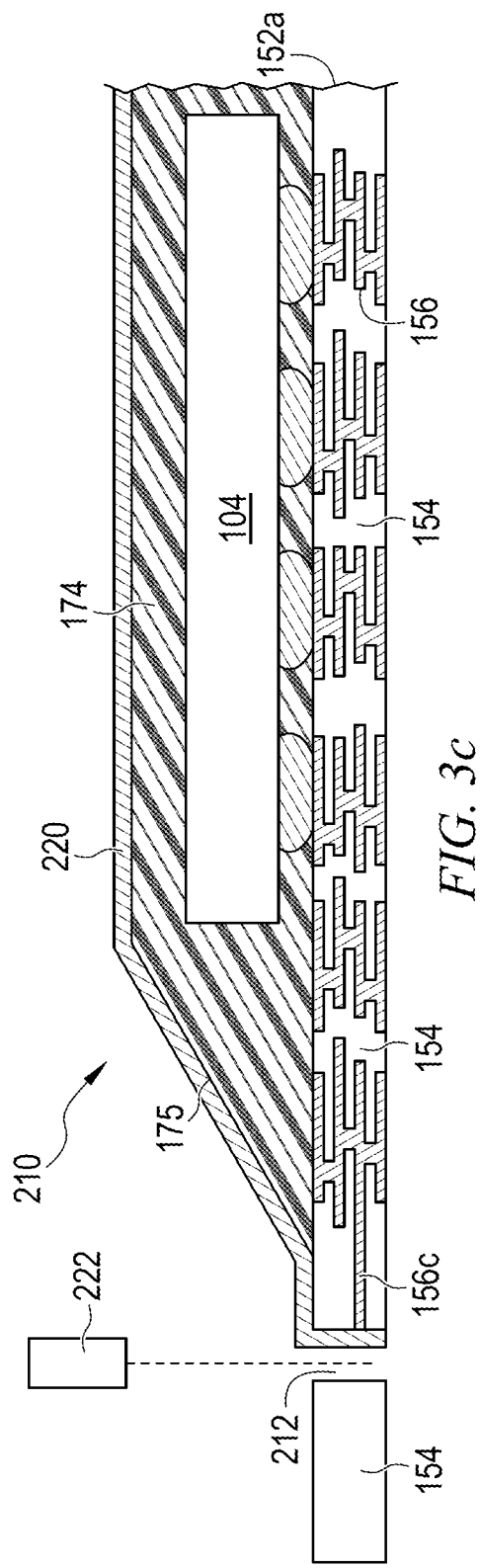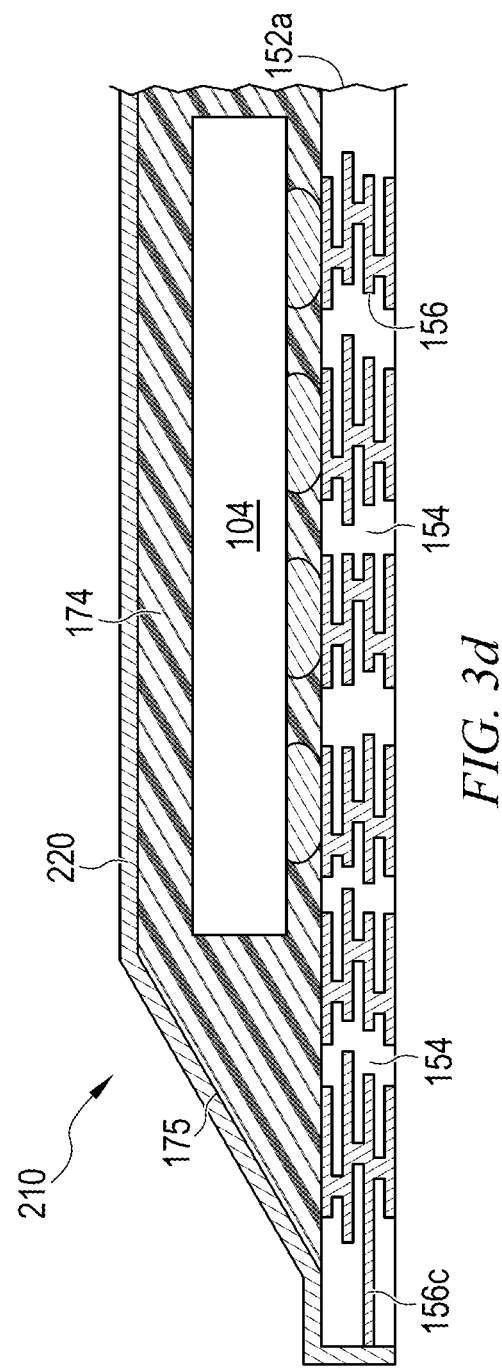

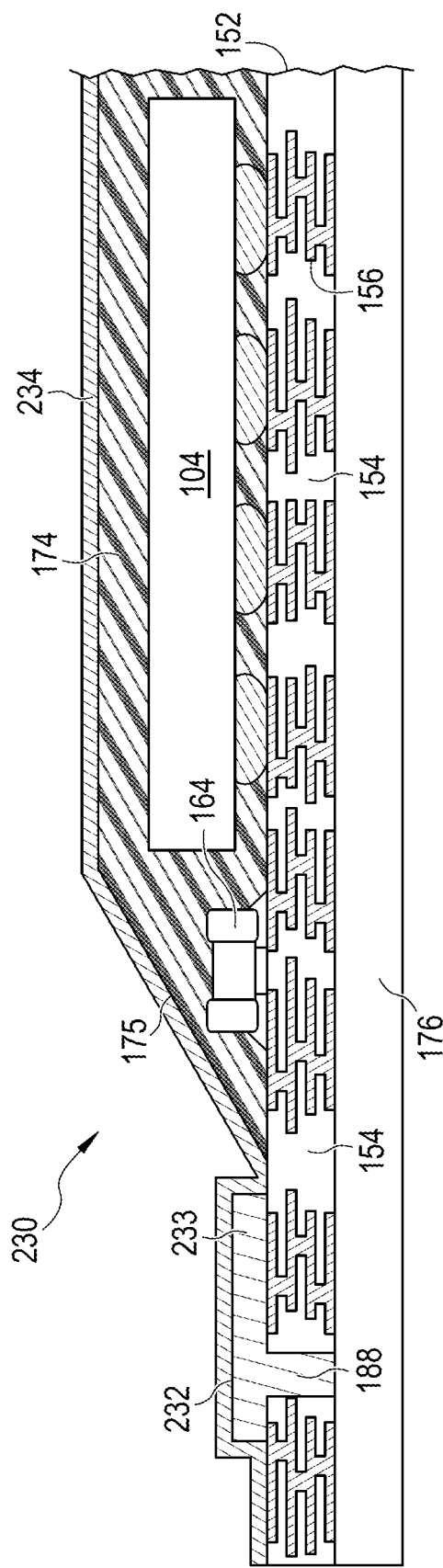
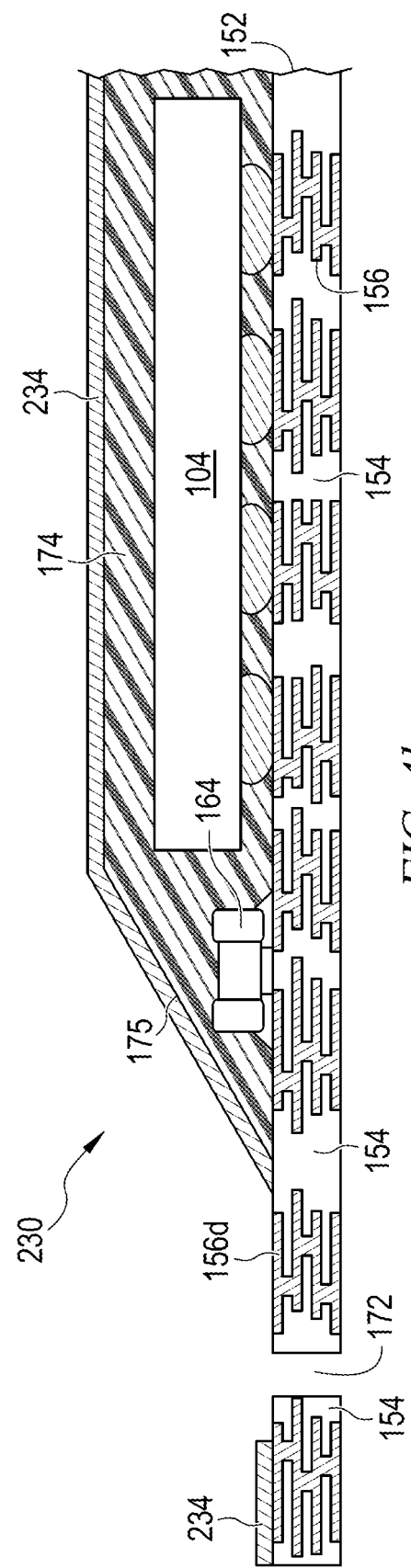
FIG. 4a
FIG. 4b

SEMICONDUCTOR DEVICE AND METHOD FOR SELECTIVE EMI SHIELDING USING A MASK

FIELD OF THE INVENTION

The present invention relates in general to semiconductor devices and, more particularly, to a semiconductor device and method for selective electromagnetic interference (EMI) shielding using a mask.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. High-speed analog circuits, e.g., radio frequency (RF) filters, or digital circuits also generate interference.

EMI shielding is typically formed over and around semiconductor packages to block inter-device interference. In many cases, a manufacturer may need to shield only a portion of a semiconductor package, e.g., to leave contact pads or an antenna exposed. However, applying shielding to only a portion of a semiconductor package remains a challenge. A mask must be applied prior to forming the shielding layer and then removed afterwards. The masks have many problems, including being technically challenging to place and remove, susceptible to shifting during processing, and difficult to use with unconventionally shaped packages. Therefore, a need exists for an improved device and method for selective EMI shielding using a mask.

BRIEF DESCRIPTION OF THE DRAWINGS

FIGS. 3a-3d illustrate slots to allow the forming of a shielding layer on a side surface of a substrate;

FIGS. 4a and 4b illustrate a flat mask;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
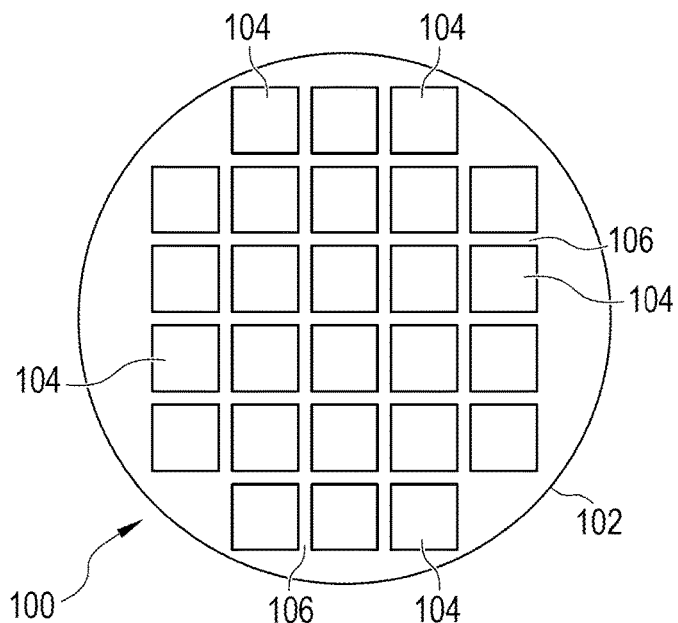
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
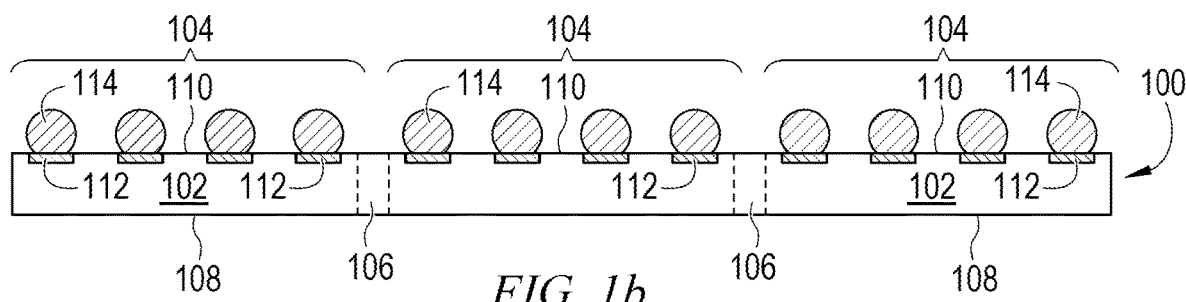

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

Figure 1C:
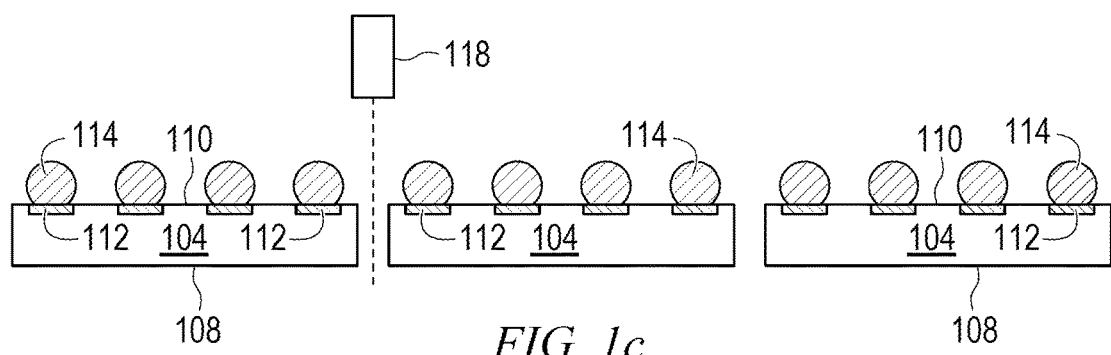

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2C:
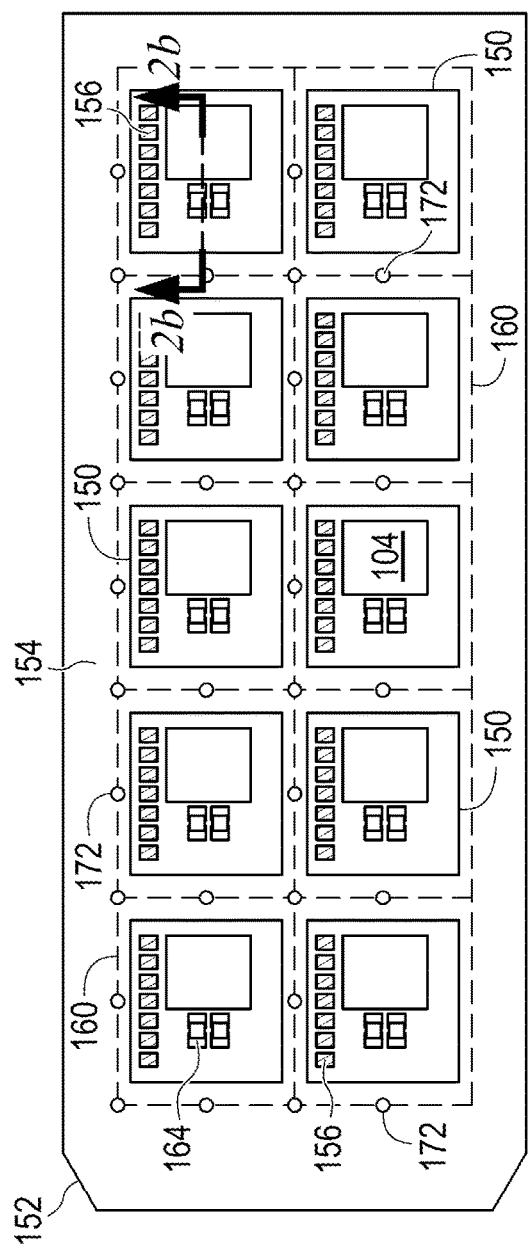
FIGS. 2a-2q illustrate forming a selectively shielded semiconductor package using a mask.
Figure 2D:
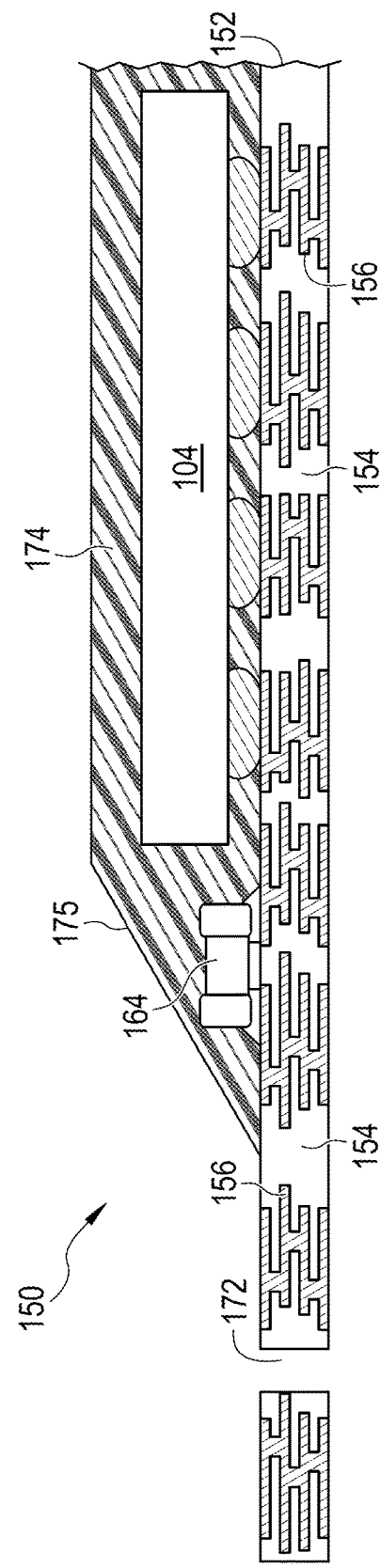
Figure 2E:
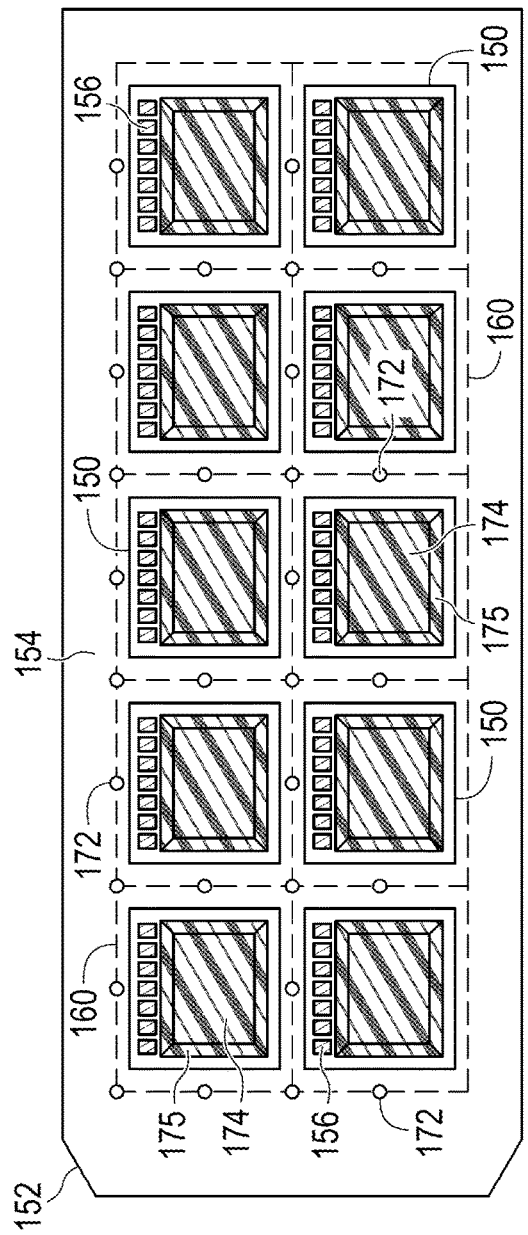
Figure 2F:
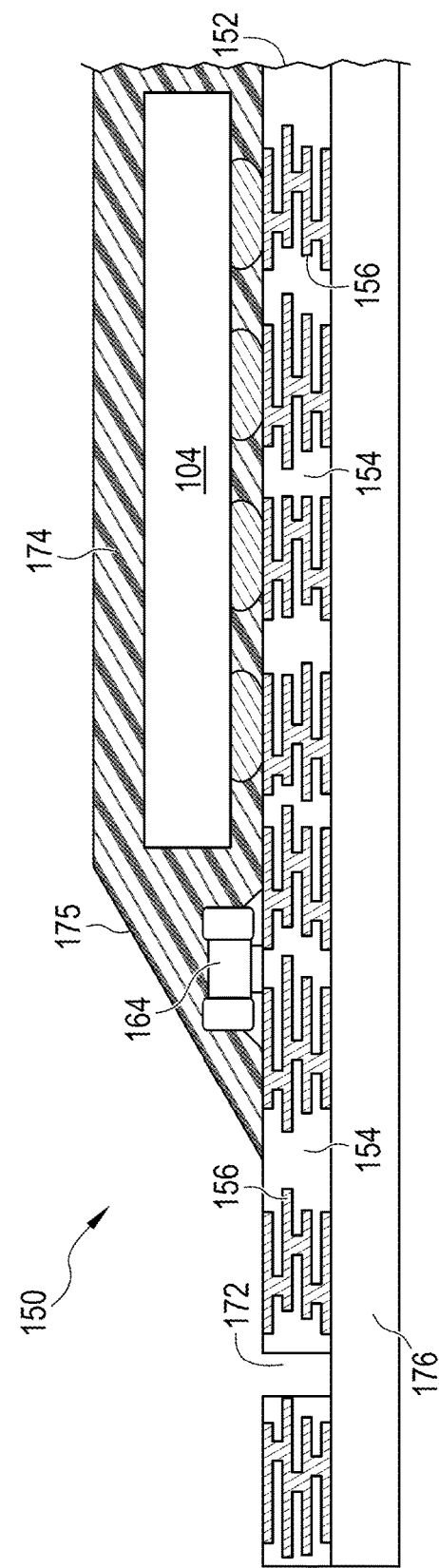
Figure 2H:
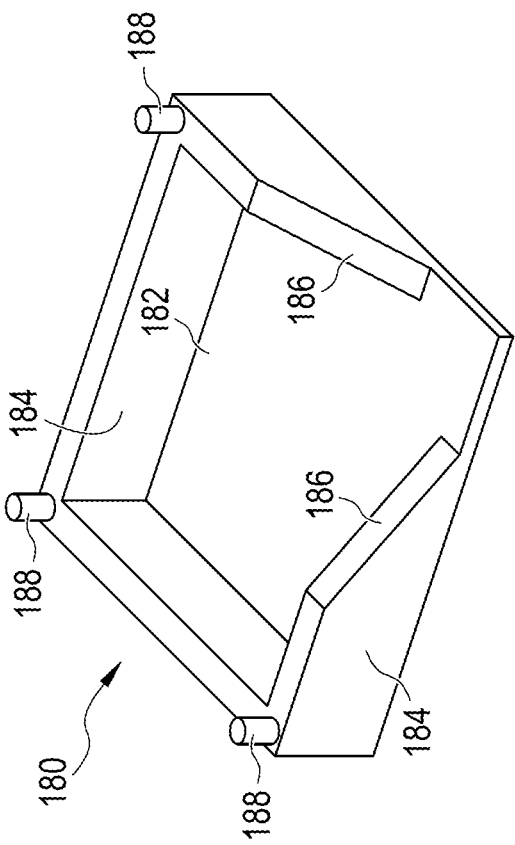
Figure 2G:
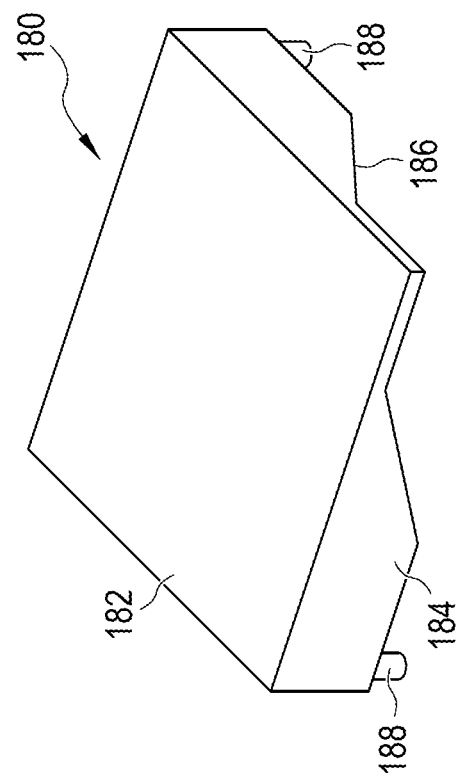
Figure 2I:
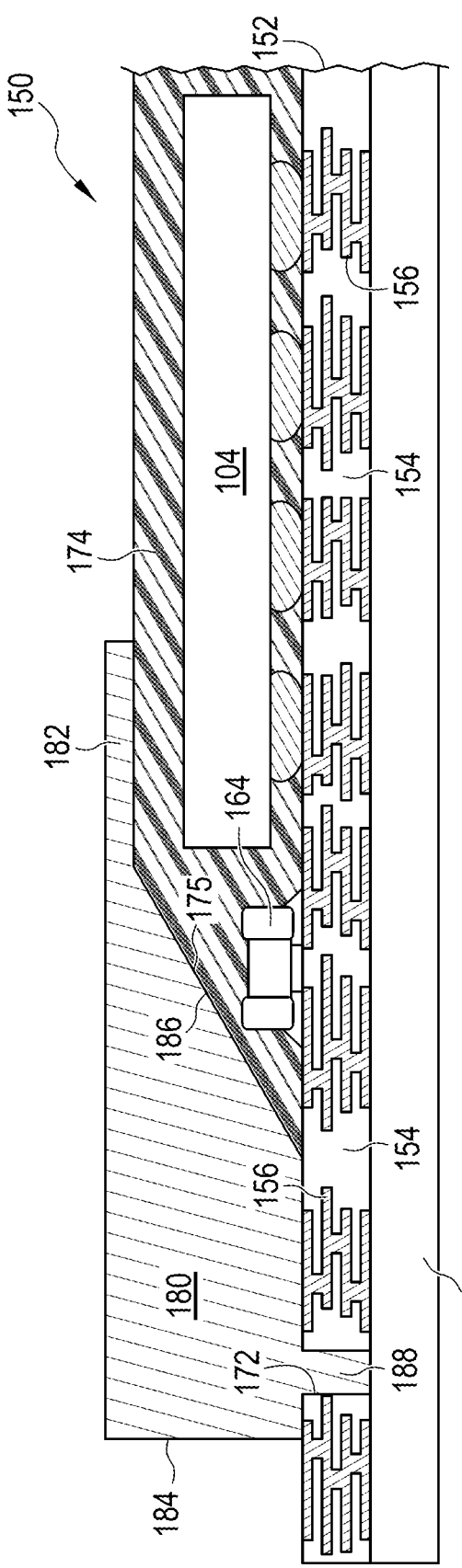
Figure 2J:
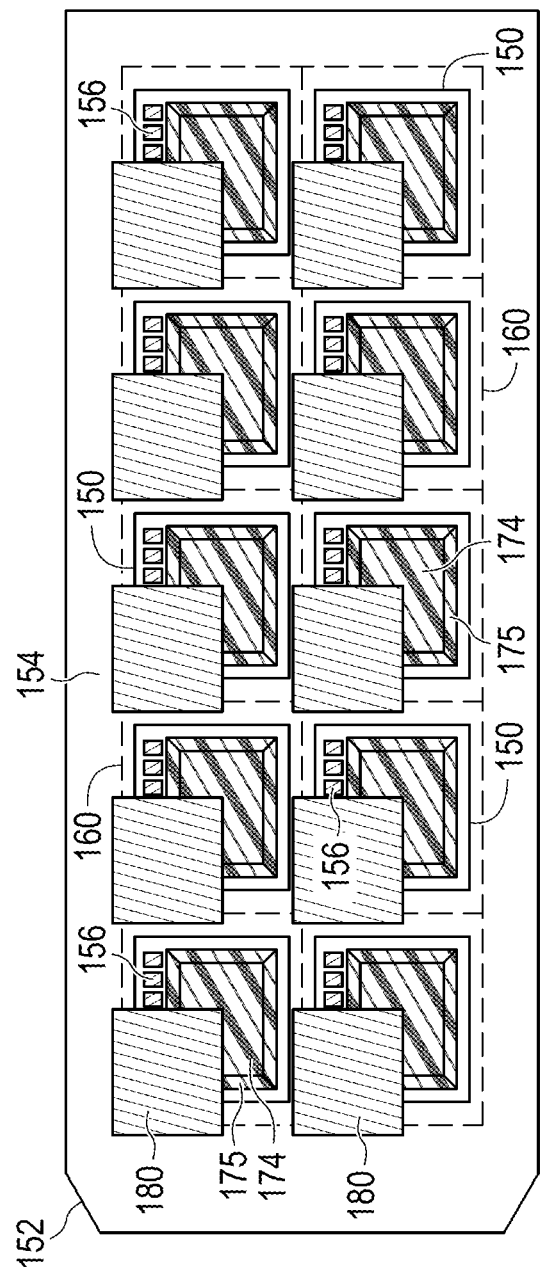
Figure 2M:
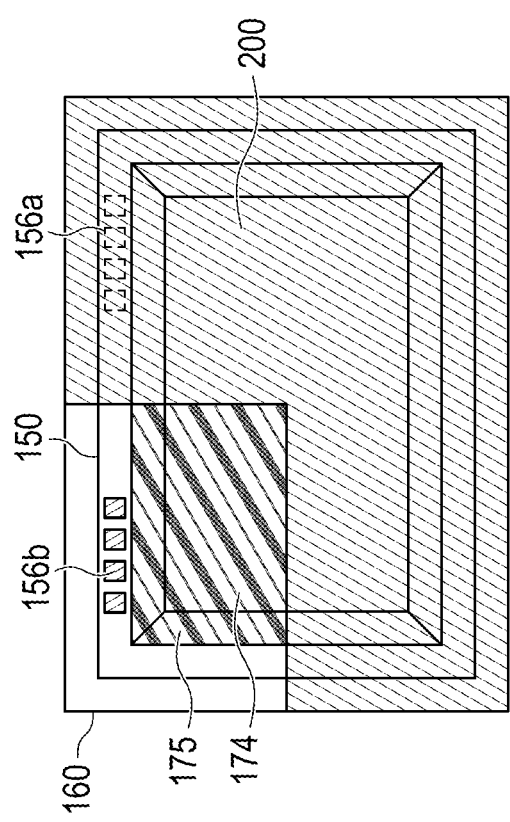
Figure 2N:
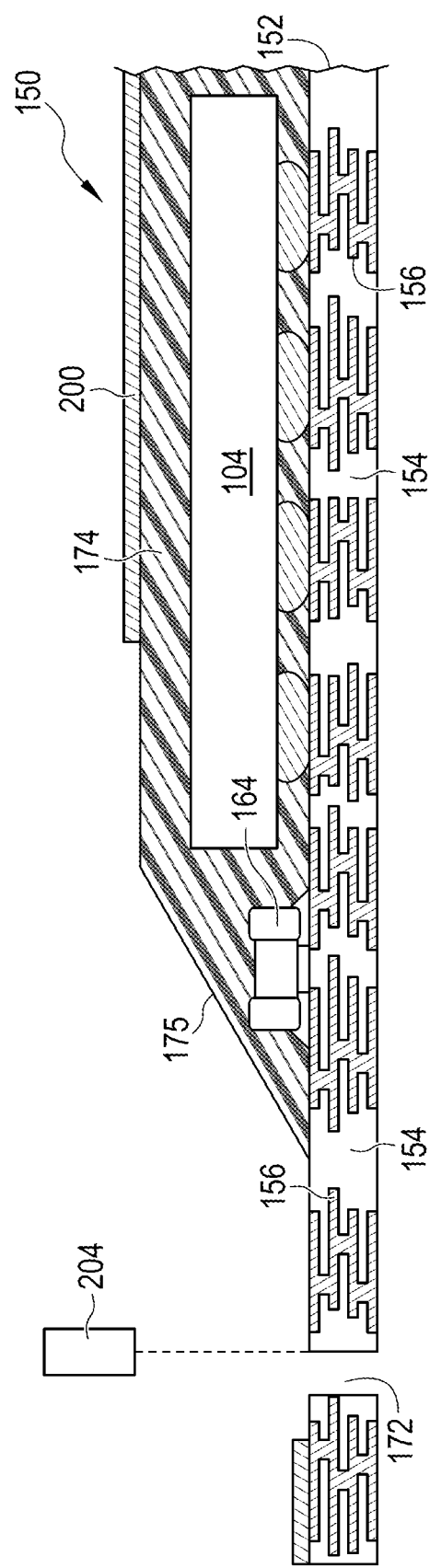
Figure 2O:
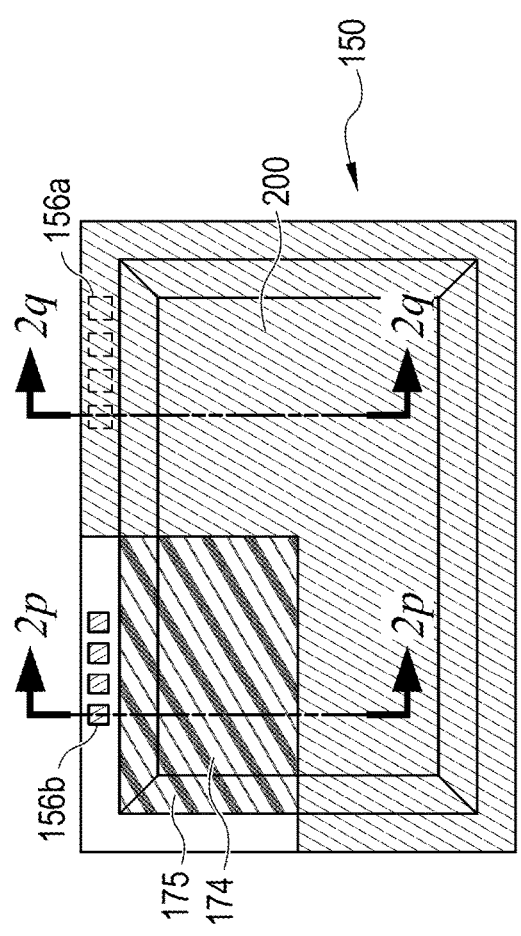
Figure 2P:
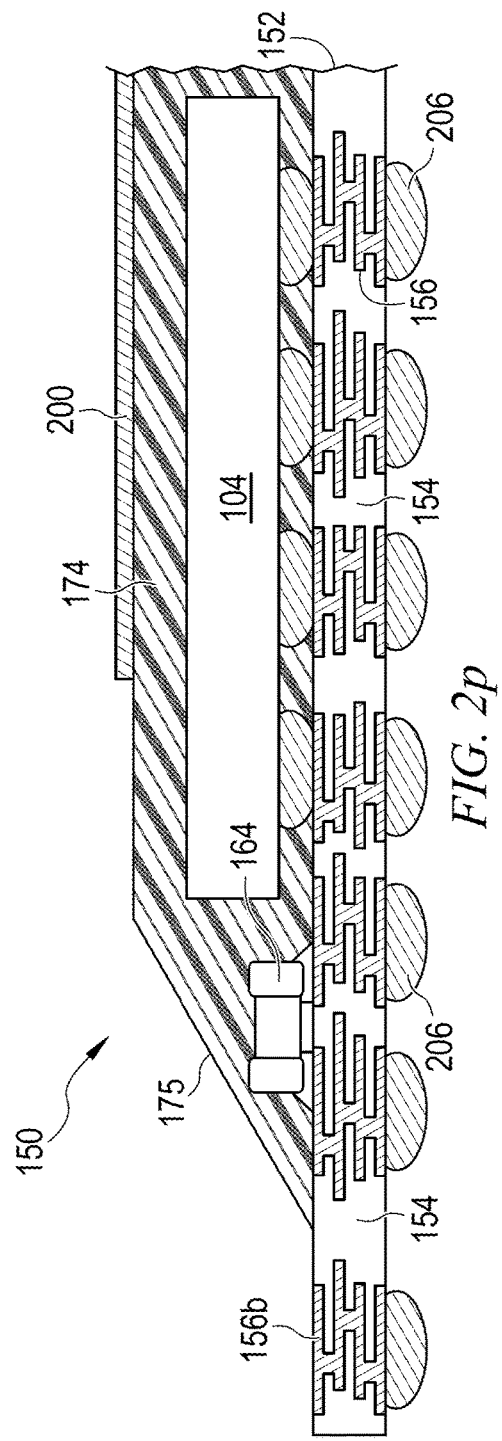
Figure 2Q:
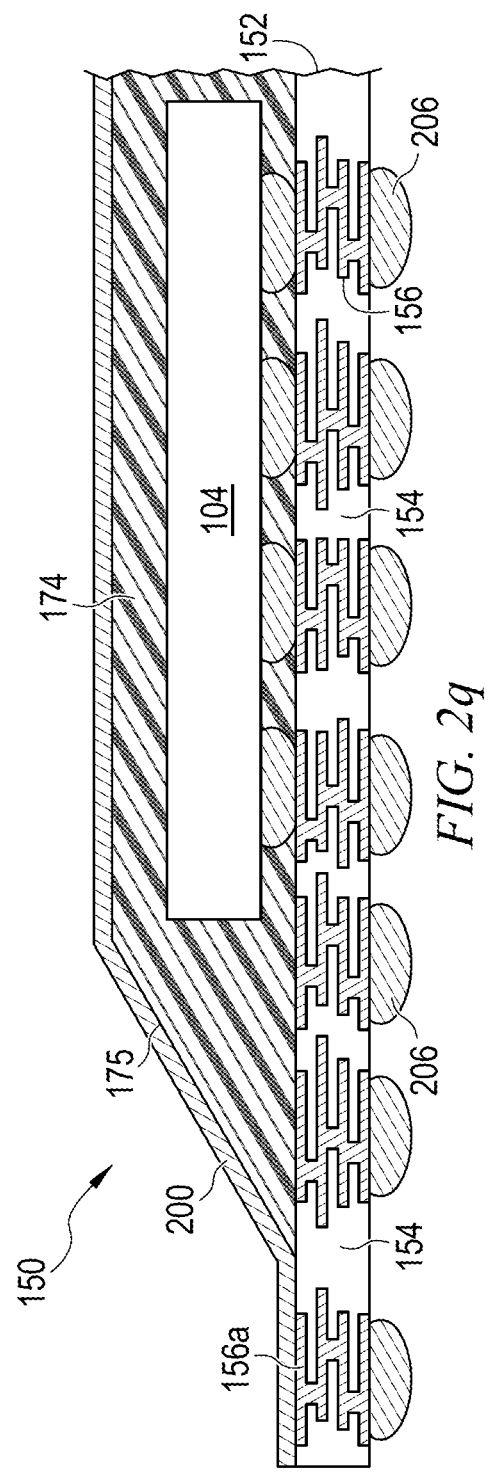

FIGS. 2a-2q illustrate forming selectively shielded semiconductor packages 150 with semiconductor die 104. FIG. 2a shows a strip substrate 152. Substrate 152 is sized to allow ten packages 150 to be formed at once, but hundreds of thousands of units are commonly formed on one strip substrate.

FIG. 2b shows a partial cross-section of substrate 152. Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

FIG. 2a shows square outlines for each package 150 for reference, but the package outlines may or may not be printed onto substrate 152. Saw streets 160 between each package 150 are illustrated with dotted lines down the center of the saw streets. Dots 162 are drawn in saw streets 160 as locations that holes will be drilled in subsequent steps. The holes will aid in placement of masks, and are therefore formed adjacent to portions of packages 150 that will be masked during shielding layer formation.

Manufacturing of packages 150 on substrate 152 commences in FIG. 2b with the surface mounting of semiconductor die 104 and discrete component 164 onto substrate 152. Any components desired to implement the intended functionality of packages 150, either in addition to or instead of those illustrated, are mounted to or disposed over substrate 152 and electrically connected to conductive layers 156. FIG. 2b shows semiconductor die 104 and discrete components 164 mounted onto substrate 152 as merely one example.

Semiconductor die 104 can be picked and placed onto substrate 152 with bumps 114 on contact pads of conductive layer 156. Discrete components 164, e.g., resistors, capacitors, inductors, transistors, or diodes, are mounted using solder paste or another suitable attachment and connection mechanism. The solder paste can be reflowed between terminals of discrete components 164 and contact pads of conductive layers 156 at the same time as bumps 114 are reflowed to attach semiconductor die 104. In some embodiments, an adhesive or underfill layer is used between semiconductor die 104 and substrate 152.

In addition to mounting any desired electrical components, a laser or mechanical drill, or another cutting tool 168 is used in FIG. 2b to drill holes 172 at the locations where dots 162 were illustrated. Drilling of holes 172 can be performed by the manufacturer creating packages 150 with substrate 152, or by a separate manufacturer of the substrates in advance. A width or diameter of holes 172 is selected to approximately match legs of a mask to be used in subsequent process steps. Holes 172 can be formed before or after mounting of semiconductor die 104 and discrete component 164. FIG. 2c shows a plan view with points 162 drilled to form holes 172.

In FIG. 2d, an encapsulant or molding compound 174 is deposited over substrate 152, semiconductor die 104, and discrete components 164 using a paste printing, compressive molding, transfer molding, liquid encapsulant molding, vacuum lamination, spin coating, or other suitable applicator. Encapsulant 174 can be polymer composite material, such as an epoxy resin, epoxy acrylate, or polymer with or without a filler. Encapsulant 174 is non-conductive and environmentally protects the semiconductor device from external elements and contaminants. Encapsulant 174 also protects semiconductor die 104 from degradation due to exposure to light.

Encapsulant 174 includes sloped side surfaces 175. The sloped surfaces 175 extend around the entire perimeter of encapsulant 174 as shown in the plan view in FIG. 2e. FIGS. 2d and 2e show packages 150 in the same stage of manufacture.

A polyimide (PI) or other type of tape 176 is laminated onto the bottom surface of substrate 152 in FIG. 2f. Tape 176 is adhesive to stick to substrate 152, and also so that an adhesive surface of the tape is exposed within openings 172. With tape 176 applied to substrate 152, the substrate is ready for masks 180 to be disposed over packages 150.

FIGS. 2g and 2h show top and bottom perspective views of a mask 180, respectively. Mask 180 includes a top 182 and sidewalls 184. Two sidewalls 184 include sloped surfaces 186 to allow mask 180 to conform to encapsulant 174 with sloped surfaces 175. Pillars or legs 188 are configured to be inserted into openings 172 of substrate 152. The number, position, size, and shape of legs 188 can be configured as desired but should match or be compatible with openings 172. Circular legs 188 are shown, but the shape can be square or other regular or irregular shapes. A polygonal leg 188 keeps the leg aligned within an opening 172 and reduces distortion of lid 180. Not every opening 172 needs to have a corresponding leg 188 of lid 180, but there should be an opening in substrate 152 for each leg. In the illustrated embodiment, each package 150 includes 3 adjacent openings 172 corresponding to 3 legs 188 of masks 180. Mask 180 is typically molded or formed from a metal, such as steel, aluminum, gold, copper, and alloys thereof. Any suitable metal or non-metal material is used in other embodiments.

FIG. 2i shows a lid 180 installed over a package 150 using a pick-and-place machine or process, or another suitable means. Leg 188 is disposed within opening 172 and extends down to tape 176. The adhesive on tape 176 contacts legs 188 and stabilizes lid 180. Sloped surfaces 186 of mask 180 sit on or slightly over sloped surfaces 175 of encapsulant 174. Top 182 sits on or slightly over the top of encapsulant 174. FIG. 2j shows a plan view of substrate 152 with lids 180 disposed over each unit. The two sloped surfaces 186 of lid 180 allow the lid to be placed over a corner of encapsulant 174 and conform to two sloped surfaces 175 having different slope directions.

In FIG. 2k, a conductive material is sputtered over packages 150 and masks 180 to form a conductive shielding layer 200. Shielding layer 200 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable conductive material. In some embodiments, shielding layer 200 can be made by sputtering on multiple layers of differing material, e.g., stainless steel-copper-stainless steel or titanium-copper. Shielding layer 200 reduces electromagnetic interference (EMI) between the components of package 150 and other nearby electronic devices. Shielding layer 200 is optionally grounded through conductive layers 156 to improve EMI reduction.

Shielding layer 200 is formed over the entire strip substrate 152, including on encapsulant 174 and lid 180. In FIG. 2l, lid 180 is removed along with the portion of shielding layer 200 that was formed on the lid. Lid 180 is removed using the same or a similar process that was used to place the lid onto substrate 152, e.g., using a pick-and-place machine. Lids 180 can be placed back into a tray or other storage medium after use and then reused later for another substrate 152 with additional packages 150 being formed.

Removing lid 180 exposes a portion of substrate 152 and a portion of encapsulant 174 as shown in FIGS. 2l and 2m. The plan view of 2m shows conductive layer 156 with shielding layer 200 formed directly on contact pads 156a while contact pads 156b are exposed from the shielding layer. Contact pads 156a are optionally used to electrically couple shielding layer 200 to a ground voltage node to improve shielding capability. Contact pads 156b remain exposed for subsequent mounting of components outside of shielding layer 200, to provide a temporary connection to semiconductor die 104 for diagnostics, or for other suitable purposes. An antenna may be located within encapsulant 174 or embedded within substrate 152 in the area free from shielding layer 200. Being free of shielding layer 200 allows the antenna to transmit and receive without being blocked by the shielding layer.

In FIG. 2n, packages 150 are singulated through saw streets 160 to separate the packages. FIGS. 2o, 2p, and 2q show a completed and singulated package 150. FIGS. 2p and 2q are two different cross-sectional views to illustrate the difference between areas of substrate 152 covered by shielding layer 200 and areas of the substrate exposed from the shielding layer. Bumps 206 are formed before or after singulation using a similar process as described above for bumps 114 on semiconductor die 104.

Packages 150 are selectively shielded, which means that a portion of the final packages remains without shielding layer 200. The unshielded area is useful for allowing an antenna to transmit and receive radio frequency signals or for making subsequent electrical connections after packages 150 are complete. Having a mask 180 that is applied using a pick-and-place process and is reusable reduces cost and makes manufacturing easier. Applying shielding at the strip level increases the number of units per hour that can be manufactured compared to shielding applied at the unit level. Using openings 172 in substrate 152 and legs 188 of mask 180 allows the masks to be used at the strip substrate level instead of requiring that the mask sidewalls fit around a unit substrate.

Package 150 includes extra footprint space outside of encapsulant 174 so that contact pads can be exposed for coupling shielding layer 200 to ground. However, other embodiments require smaller substrates without the option for extra space being dedicated to connecting a shielding layer to ground. FIGS. 3a-3d show an embodiment with the shielding layer connected to conductive layer 156 on a side surface of substrate 150 instead of the top surface.

Figure 3A:
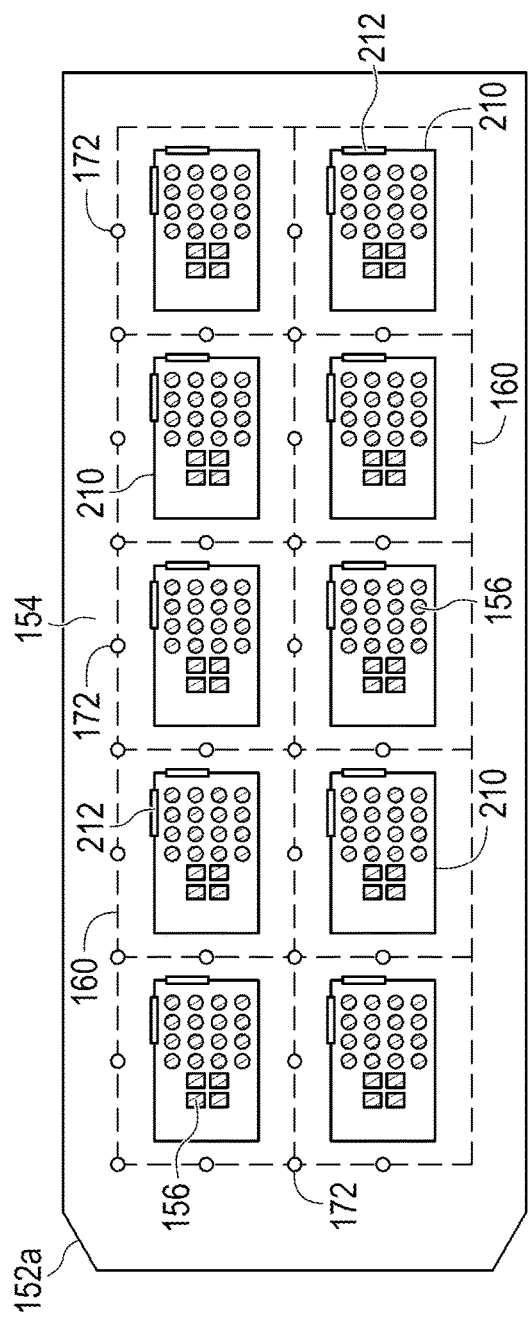
Figure 3B:
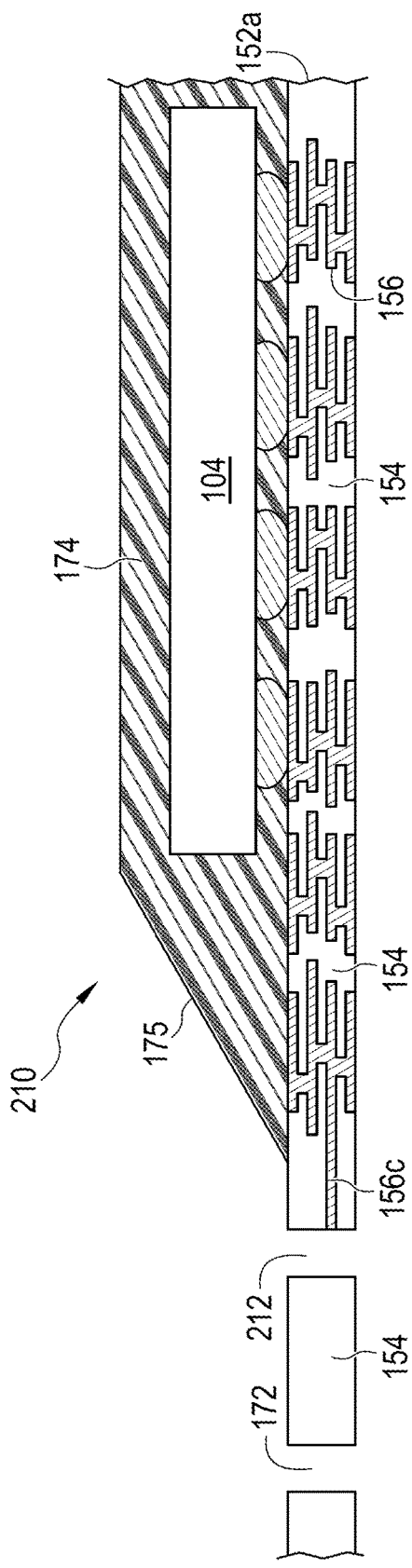

FIG. 3a shows substrate 152a with a similar structure and layout as substrate 152. Packages 210 being formed on substrate 152a have a smaller footprint than packages 150. Slots 212 are formed through substrate 152a along the edges of packages 210. FIG. 3b shows a cross-section with semiconductor die 104 and encapsulant 174 added. A portion 156c of conductive layer 156 extends to slot 212 so that the conductive layer is exposed within the slot.

In FIG. 3c, shielding layer 220 has been formed over encapsulant 174 in a similar manner to shielding layer 200. Shielding layer 220 extends into slot 212 to physically and electrically contact portion 156c of conductive layer 156. Conductive layer 156 couples shielding layer 220 to ground during use of package 210 to improve performance of the shielding layer. A mask 180 is used to selectively shield package 210 as illustrated above.

With shielding layer 220 formed, packages 210 are singulated from substrate 152a. Singulation occurs through slots 212 as the slots are formed on the edges of the packages. The cut required for singulation is made shorter because slots 212 contribute to the perimeter being singulated. Slots 212 are formed internal to the package 210 footprint in other embodiments. FIG. 3d shows a singulated package 210.

FIGS. 4a and 4b illustrate a flat mask design. Mask 232 in FIG. 4a includes legs 188 like mask 180, but unlike mask 180 does not include sidewalls or extend over encapsulant 174. Rather, mask 232 includes a single planar area 233 that sets directly on the top surface of substrate 152. Planar area 233 covers any portions of substrate 152 where a shielding layer is undesired, e.g., contact pads for subsequent mounting of components or an integrated antenna structure. Shielding layer 234 is formed over encapsulant 174, substrate 152, and mask 232.

Mask 232 is removed in FIG. 4b, which removes the portion shielding layer 234 formed on the mask and exposes contact pad 156d for later use. Using a flat mask 232 results in a portion of substrate 152 being exposed from shielding layer 234 while encapsulant 174 is completely covered by the shielding layer.

Figure 5A:
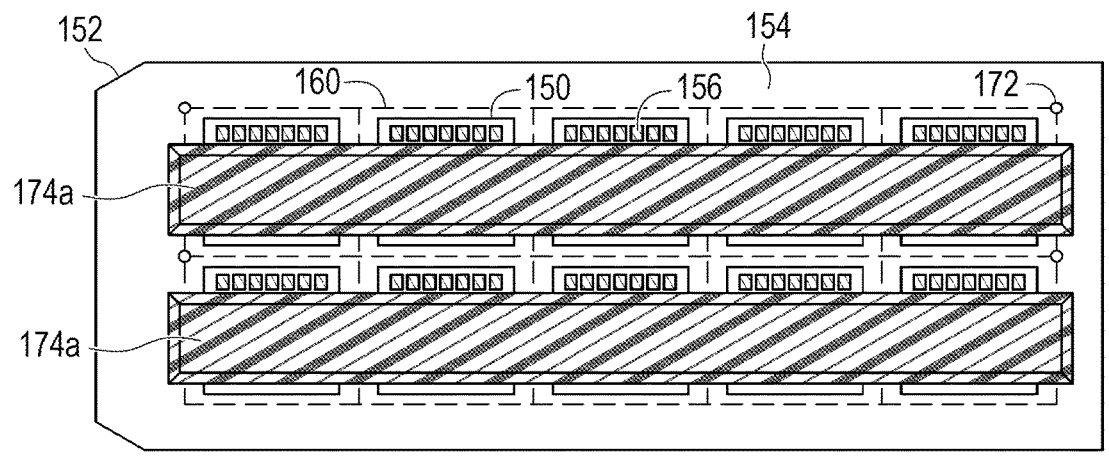
FIGS. 5a-5c illustrate a strip mask.
Figure 5B:
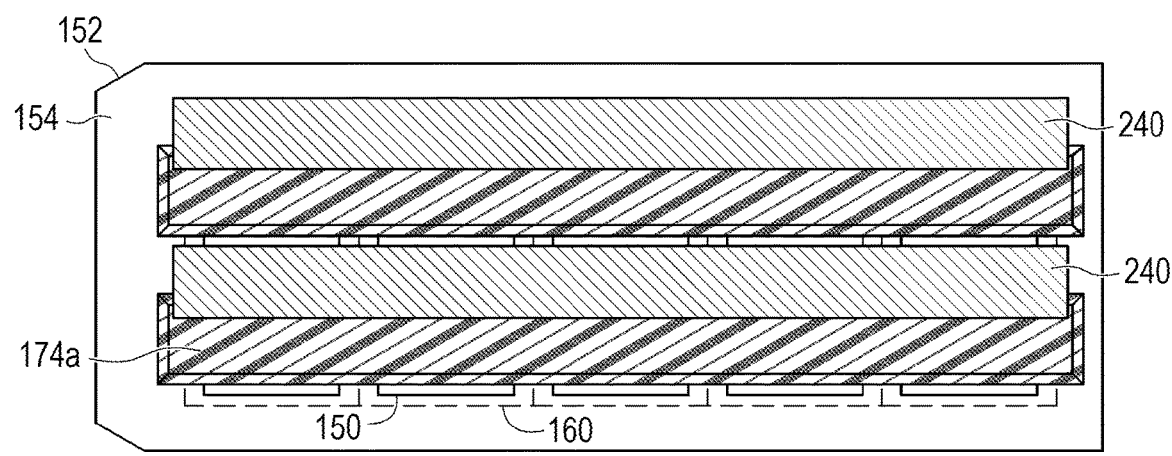
Figure 5C:
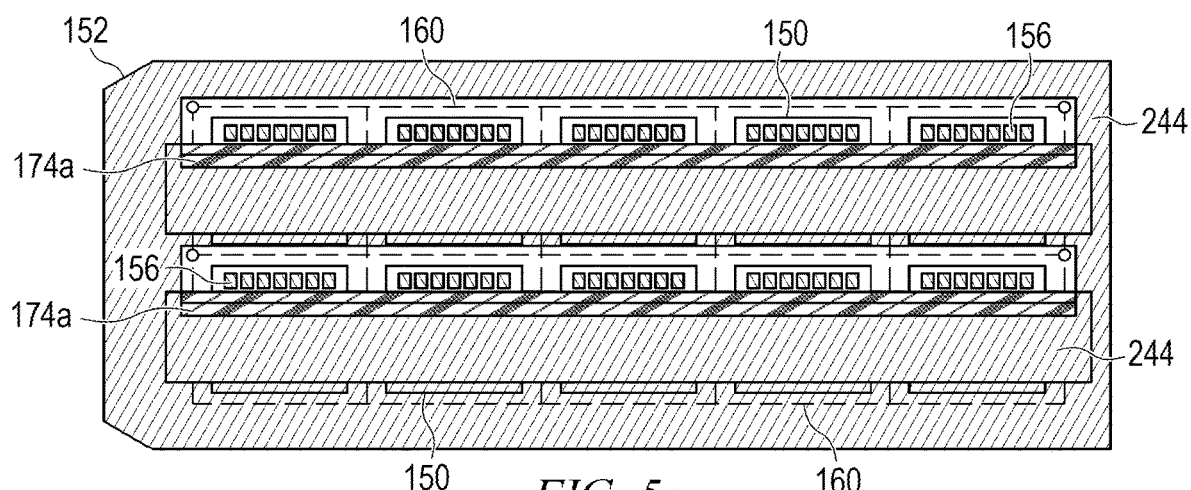

FIGS. 5a-5c illustrate an embodiment with strips of encapsulant 174a that extend across multiple units within strip substrate 152. A mold with longer cavities is used so that each strip of encapsulant 174a extends for an entire column or row of packages 150. Only two openings 172 are used, one at each end of a row of units. In other embodiments, intermediate openings 172 are formed for additional stability. Masks 240 in FIG. 5b are disposed along the length of a strip of encapsulant 174a so that each masks covers a portion of multiple packages 150. Legs 188 of masks 240 extend into openings 172. Masks 240 have sidewalls 184 and sloped surfaces 186 to extend up and over encapsulant 174a. In other embodiments, masks 240 are flat and only cover a portion of substrate 152 without extending over encapsulant 174a.

Substrate 152 and mask 240 are sputtered with a conductive material to form shielding layer 244 in FIG. 5c. Shielding layer 244 extends over each package 150 being formed. Masks 240 are removed to expose the protected areas of encapsulant 174a and substrate 152.

FIGS. 6a-6d illustrate using masks for selective shielding of more complex package shapes. Packages 250 are being formed on substrate 252 in FIG. 6a. Substrate 252 is structured similarly to substrate 152, but configured for a different package shape. Packages 250 have a complex shape including an encapsulant 254 with a complex shape. A curved side 256 of package 250 also includes a curve to encapsulant 254. Encapsulant 254 also has a concavity 258 that increases complexity. Package 250 also has concavities in other embodiments.

In embodiments that use transfer molding or injection molding, encapsulant 254 is deposited using a mold with each chamber connected to adjacent chambers that allows the deposited molding compound to flow between packages 250. The areas of encapsulant 254 shown in FIG. 6a will be interconnected by paths or bridges of encapsulant between them after molding. The encapsulant path connecting the illustrated areas of encapsulant 254 is removed prior to completion of packages 250.

Holes 172 are formed near areas of packages 250 that are to remain exposed from shielding. Masks 180a and 180b are disposed over packages 250 in FIG. 6b. Masks 180a and 180b include legs 188 that extend down into holes 172, and side walls that conform to the shape of encapsulant 254. The side walls of masks 180a and 180b can be rounded, multi-angled, or otherwise shaped, rather than just sloped as with masks 180, in order to match the shape of encapsulant 254. Masks 180a cover rounded sides 256 and masks 180b cover concavities 258. Using masks with sidewalls allows the mask to cover complex shapes without having to form the mask with the same complex shape being covered. Concavities 258 are covered without mask 180b having a concavity. The more complex of a shape a package being shielded has, the more manufacturing complexity is reduced by using a mask 180 instead of a prior art mask.

Figure 6A:
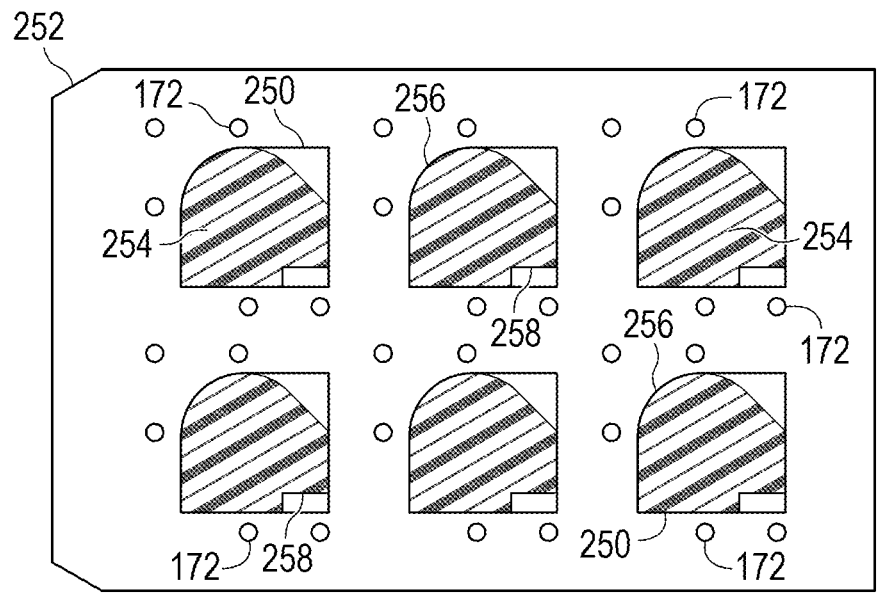
FIGS. 6a-6d illustrate an irregularly shaped package selectively shielded using masks.
Figure 6B:
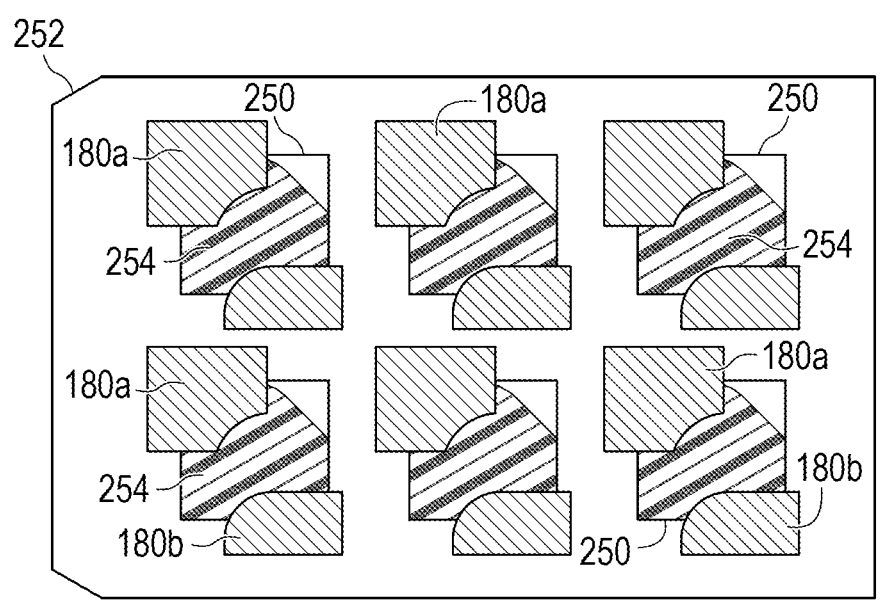
Figure 6C:
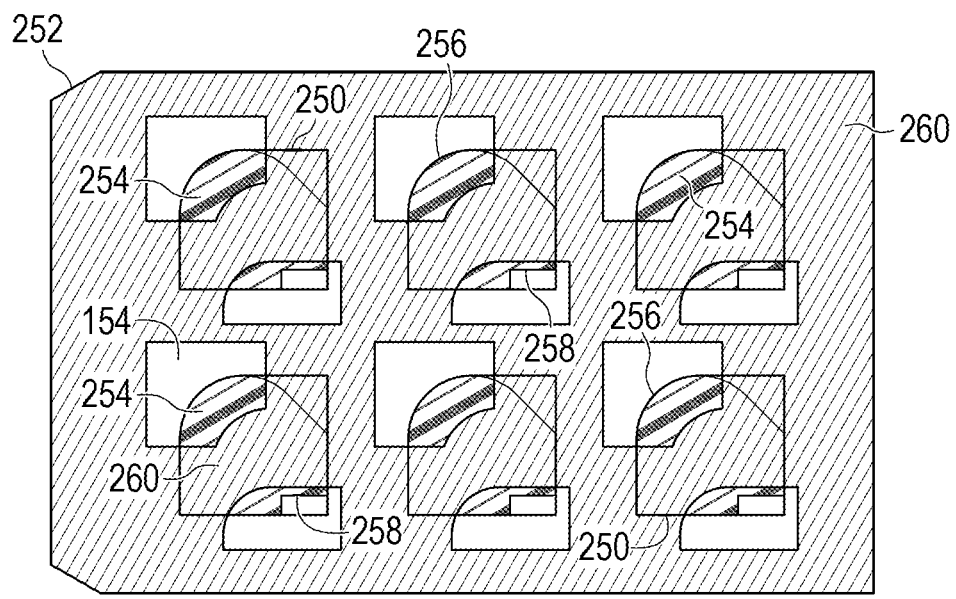
Figure 6D:
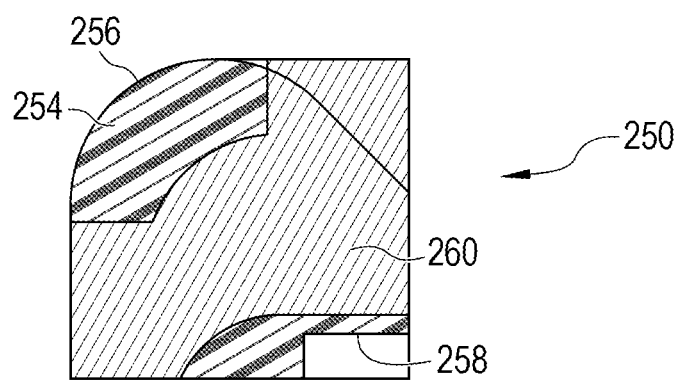

FIG. 6c shows substrate 252 after a shielding layer 260 is formed over the substrate with masks 180a and 180b. Masks 180a and 180b are removed to expose the portions of packages 250 that were protected by the masks. Rounded sides 256 and concavities 258 remain exposed from shielding layer 260. FIG. 6d shows a completed package 250 singulated from substrate 252.

Figure 7:
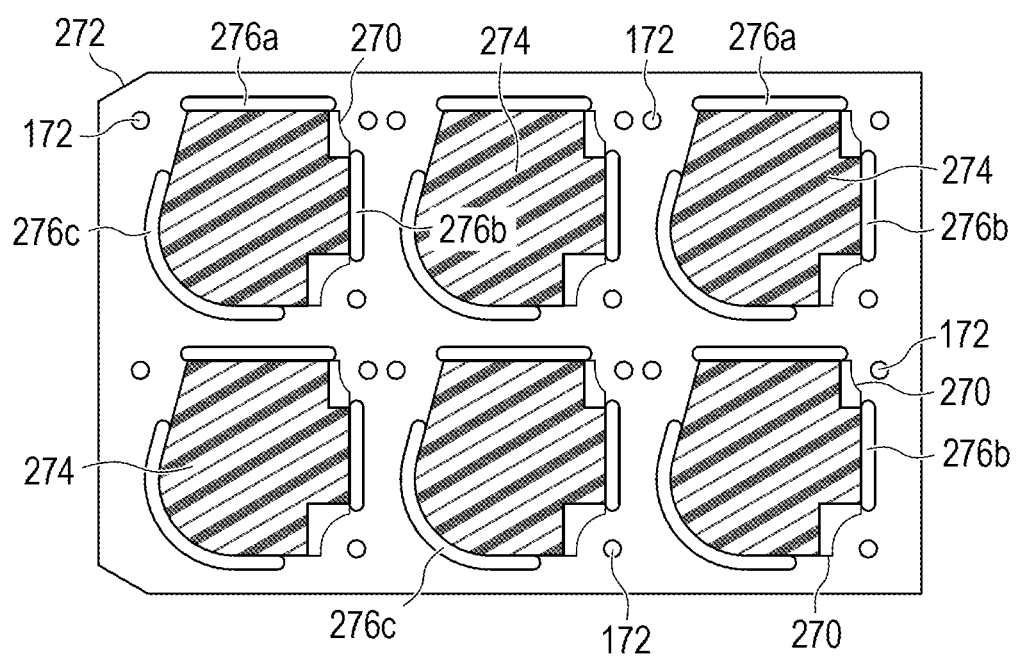
FIG. 7 illustrates using slots with the irregularly shaped packages.

FIG. 7 illustrates combining the complex package shapes of FIGS. 6a-6d with the grounding slot embodiment of FIGS. 3a-3d. Packages 270 are being formed on substrate 272 in FIG. 7. Packages 270 have a complex shape similar to packages 250. Encapsulant 274 has multiple concavities and a curved side. Packages 270 themselves have multiple concavities. Slots 276 are formed through substrate 272 adjacent to encapsulant 274 so that, when a shielding layer is formed over the encapsulant, the shielding layer will extend down into the slots and contact conductive layers of the substrate.

Slots 276a and 276b follow straight lines along linear sides of encapsulant 274. Slot 276c curves along the curved side of encapsulant 274. Slots 276 are formed using a laser, saw, or other cutting tool and can be made to conform along any shape of encapsulant, no matter how complex. When packages 270 are singulated, a blade or laser cuts between slots 276. Slots 276 are removed, leaving a shielding layer formed on the side of the package including the side of substrate 272. The shielding layer is formed at the strip level which increases throughput and reduces manufacturing defects that happen with unit level processing.

In some embodiments, the above-described packages, e.g., package 250, are a complete stand-alone electrical system that is fully functional by itself. A plastic molding or other type of case is made to hold substrate 252 in place within a product such as a wireless headphone or smart watch. Package 250 can have integrated antennae for Bluetooth, WiFi, or other protocols as well as a piezoelectric or other speaker to generate noise, a screen to display a watch face, and other desired electrical components. Additional electrical devices can be connected by wire or cable if needed within the same product case. Substrate 252 is the main board of the end device. There is no other main board that package 250 is connected to.

Figure 8A:
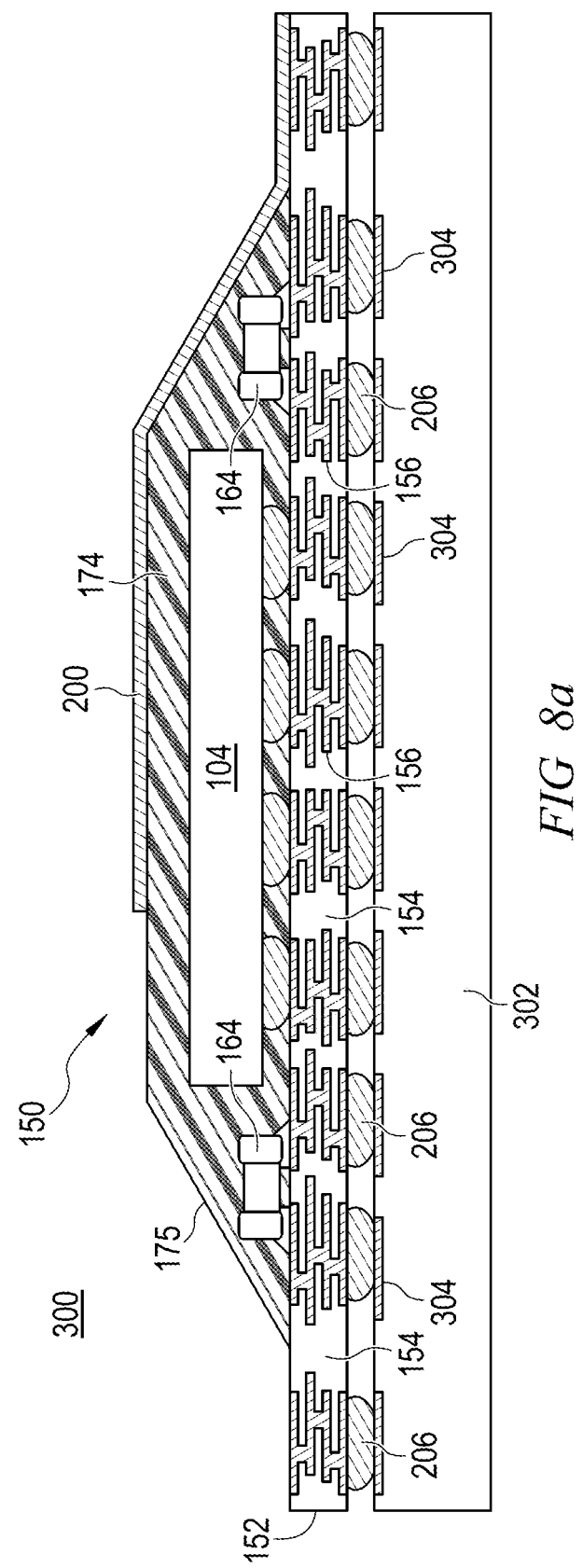
FIGS. 8a and 8b illustrate integrating the selectively shielded semiconductor packages into an electronic device.
Figure 8B:
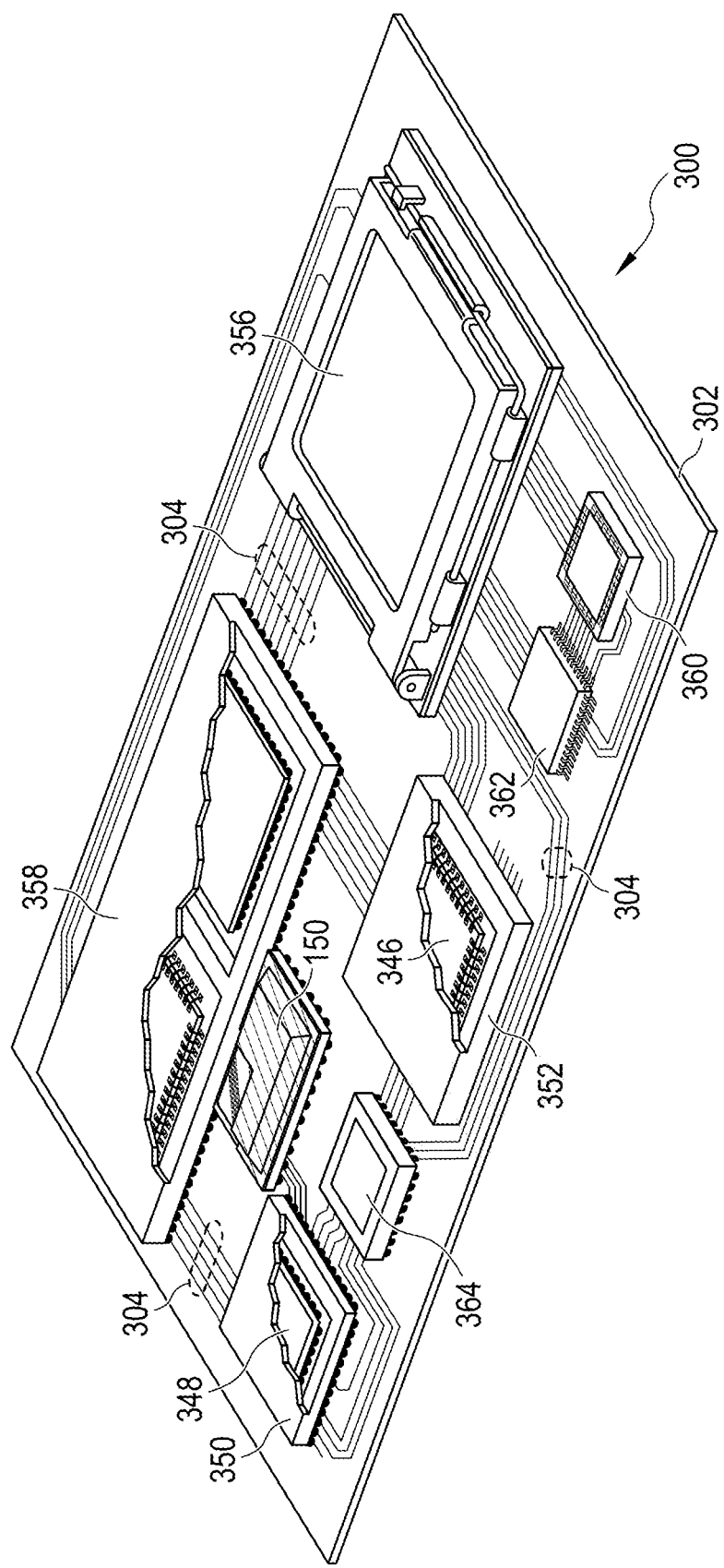

FIGS. 8a and 8b illustrate another embodiment where the above-described selectively shielded semiconductor packages, e.g., package 150, are integrated into an electronic device 300. FIG. 8a illustrates a partial cross-section of package 150 mounted onto a printed circuit board (PCB) or other substrate 302 as part of electronic device 300. Bumps 206 are reflowed onto conductive layer 304 of PCB 302 to physically attach and electrically connect package 150 to the PCB. In other embodiments, thermocompression or other suitable attachment and connection methods are used. In some embodiments, an adhesive or underfill layer is used between package 150 and PCB 302. Semiconductor die 104 are electrically coupled to conductive layer 304 through substrate 152.

FIG. 8b illustrates electronic device 300 including PCB 302 with a plurality of semiconductor packages mounted on a surface of the PCB, including package 150. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 8*b*, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 150. Conductive traces 304 electrically couple the various packages and components disposed on PCB 302 to package 150, giving use of the components within package 150 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a strip substrate including a plurality of units;
   forming a hole in the strip substrate;
   depositing an encapsulant over the strip substrate;
   disposing a mask over the strip substrate and encapsulant with a leg of the mask disposed in the hole;
   forming a shielding layer over the mask and strip substrate;
   removing the mask after forming the shielding layer; and
   singulating the strip substrate to separate the plurality of units from each other after forming the shielding layer.

2. The method of claim 1, further including disposing the mask over only a portion of the encapsulant.

3. The method of claim 1, further including:
   forming a slot in the strip substrate; and
   forming the shielding layer extending into the slot.

4. The method of claim 3, further including singulating the strip substrate through the slot.

5. The method of claim 3, wherein the slot is curved.

6. The method of claim 1, further including disposing the mask over a curved edge of the encapsulant.

7. A method of making a semiconductor device, comprising:
   providing a substrate;
   forming a hole in the substrate;
   disposing a mask over the substrate with a leg of the mask disposed in the hole, wherein the substrate extends around the leg;
   forming a shielding layer over the mask and substrate; and
   removing the mask after forming the shielding layer.

8. The method of claim 7, further including:
   depositing an encapsulant extending across a plurality of units of the substrate; and
   disposing the mask over the plurality of units.

9. The method of claim 7, wherein the mask lies flat on the substrate after disposing the mask over the substrate.

10. The method of claim 7, further including:
    forming a slot in the substrate; and
    forming the shielding layer into the slot.

11. The method of claim 7, further including depositing an encapsulant over the substrate, wherein the encapsulant includes a sloped surface.

12. The method of claim 11, further including disposing the mask over the encapsulant.

13. The method of claim 7, further including singulating the substrate into a plurality of units after removing the mask.

14. A method of making a semiconductor device, comprising:
    providing a substrate;
    forming a hole in the substrate; and
    disposing a mask over the substrate with a leg of the mask disposed in the hole, wherein the substrate extends around the leg.

15. The method of claim 14, wherein the mask lies flat on the substrate.

16. The method of claim 14, wherein the mask includes a sidewall and a top.

17. The method of claim 14, further including:
    removing the mask from the substrate; and
    disposing the mask over a second substrate.

18. The method of claim 17, further including forming a second shielding layer over the mask and second substrate.

19. The method of claim 14, further including:
    depositing an encapsulant over the substrate; and disposing the mask over a curve or concavity of the encapsulant.

20. A method of making a semiconductor device, comprising:
   providing a substrate including a hole formed in the substrate;
   disposing a mask over the substrate with a leg of the mask disposed in the hole;
   forming a shielding layer over the substrate and mask; and
   singulating the substrate after forming the shielding layer.

21. The method of claim 20, further including depositing an encapsulant over the substrate.

22. The method of claim 21, further including disposing the mask over the encapsulant.

23. The method of claim 20, further including:
   forming a slot in the substrate; and
   forming the shielding layer extending into the slot.

24. The method of claim 23, wherein the slot is curved.

25. The method of claim 20, wherein the substrate includes a plurality of units.

\* \* \* \* \*